(12) United States Patent
Hu et al.

(10) Patent No.: US 11,839,020 B2
(45) Date of Patent: Dec. 5, 2023

(54) TRACE EMBEDDED PROBE DEVICE

(71) Applicant: MPI CORPORATION, Chu-Pei (TW)

(72) Inventors: Yu-Shan Hu, Chu-Pei (TW); Yi-Lung Lee, Chu-Pei (TW); Shao-Lun Wei, Chu-Pei (TW); Yu-Wen Chou, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 4 days.

(21) Appl. No.: 17/701,017

(22) Filed: Mar. 22, 2022

(65) Prior Publication Data

US 2022/0312583 A1 Sep. 29, 2022

(30) Foreign Application Priority Data

Mar. 25, 2021 (TW) .................. 110110816
Jan. 5, 2022 (TW) .................. 111100452

(51) Int. Cl.
  *H05K 1/02* (2006.01)
  *G01R 1/073* (2006.01)
  *H05K 1/11* (2006.01)

(52) U.S. Cl.
  CPC ....... *H05K 1/0251* (2013.01); *G01R 1/07342* (2013.01); *H05K 1/115* (2013.01); *H05K 1/118* (2013.01)

(58) Field of Classification Search
  CPC ...... H05K 1/0251; H05K 1/115; H05K 1/118; H05K 3/4007; H05K 1/025; H05K 1/0219; G01R 1/07342; G01R 1/07307

USPC .................................................. 324/756.03
See application file for complete search history.

(56) References Cited

U.S. PATENT DOCUMENTS

| | | | |
|---|---|---|---|
| 2015/0301081 A1* | 10/2015 | Hirano | G01R 1/06755 324/755.01 |
| 2017/0003319 A1* | 1/2017 | Ku | G01R 31/31716 |
| 2017/0115326 A1* | 4/2017 | Ku | G01R 31/2889 |
| 2020/0266132 A1* | 8/2020 | Cho | H01L 23/49503 |

\* cited by examiner

*Primary Examiner* — Farhana A Hoque
(74) *Attorney, Agent, or Firm* — Birch, Stewart, Kolasch & Birch, LLP

(57) ABSTRACT

A trace embedded probe device includes a circuit board including an insulating layer unit whose upper surface has first recesses and a second recess located therebetween, grounding traces and a signal trace whose trace main bodies are disposed in the recesses respectively and flush in elevation with the upper surface, and a grounding layer disposed on a lower surface of the insulating layer unit and connected with the grounding traces by conductive vias penetrating through the first recesses and the lower surface and provided therein with conductive layers. The trace main bodies, grounding layer and conductive layers are made of a same metal material. Probes are disposed on the grounding and signal traces respectively. The probe device is easy in control of distance, width, thickness and surface roughness of the traces, and beneficial to achieve the requirements of thin copper traces, fine pitch and high frequency testing.

14 Claims, 8 Drawing Sheets

TRACE EMBEDDED PROBE DEVICE

BACKGROUND OF THE INVENTION

1. Field of the Invention

The present invention relates generally to probe devices of probe cards and more particularly, to a trace embedded probe device.

2. Description of the Related Art

In a conventional membrane probe card, a flexible membrane circuit board is adopted to serve as a probe head. The flexible membrane circuit board is made by drilling, electroplating, photolithography and surface treatment processes from a flexible substrate 10 whose cross section is configured as shown in FIG. 1A. The cross section of the flexible membrane circuit board 11 is configured as shown in FIG. 1B. Specifically speaking, the flexible substrate 10 is a flexible copper clad laminate (also referred to as 'FCCL' hereinafter), which includes a membranous insulating layer 12 made of polyimide (also referred to as 'PI' hereinafter) or liquid crystal polymer, and upper and lower copper layers 13 and 14 disposed on upper and lower surfaces of the insulating layer 12 respectively. The aforementioned drilling and electroplating processes provide the flexible membrane circuit board 11 with a plurality of plated through holes 15. Each plated through hole 15 is plated on the inner wall thereof with copper to electrically connect the upper and lower copper layers 13 and 14 with each other. The aforementioned photolithography process defines the flexible membrane circuit board 11 with a plurality of grounding traces 16 including the plated through hole 15, and a plurality of signal traces 17 including no such plated through hole 15, for disposing grounding probes and signal probes (not shown), such as bumps formed on the flexible membrane circuit board 11, at appropriate positions on the grounding traces 16 and signal traces 17 respectively. The aforementioned surface treatment process uses electroless nickel immersion gold (also referred to as 'ENIG' hereinafter) to make the copper surface of each trace 16 or 17 covered by a protective layer 18 including a nickel layer and a gold layer for preventing copper from oxidation.

However, it is practically hard to control the quantity of copper etched in the aforementioned photolithography process, so that it is hard to control the widths and thicknesses of the traces 16 and 17, and each trace 16 or 17 is practically shaped with narrower top and wider bottom, like the trace 17 shown in FIG. 2. Such trace shape will affect the impedance matching of the grounding trace 16 and the signal trace 17. Besides, the photolithography process also makes the copper surface rough, resulting in loss of high frequency signal during transmission. In addition, because the widths of the traces 16 and 17 are hard to control, it will be difficult for the probes to meet the requirement of fine pitch. As shown in FIG. 2, in practice the copper layer of each trace 16 or 17 includes the original copper layer 13 of the flexible substrate 10 and another copper layer 19 formed from the copper produced in the above-described electroplating process and partially removed by the above-described photolithography process. Therefore, it is hard to form thin copper traces, and the copper layer 19 is different in thickness from the copper located on the inner wall of the plated through hole 15 in that the copper located on the inner wall is relatively thicker. Furthermore, the protective layer 18 provided on the surface of each trace 16 or 17 is generally made by a material having a relatively higher electric resistivity. Therefore, when transmitting high frequency signal, the traces 16 and 17 are liable to provide a relatively lower electric conductivity because of skin effect. However, if the protective layer 18 is omitted under the consideration of high frequency, the naked copper will have oxidation problem.

SUMMARY OF THE INVENTION

The present invention has been accomplished in view of the above-noted circumstances. It is an objective of the present invention to provide a trace embedded probe device which can solve at least one problem of the prior art.

To attain the above objective, the present invention provides a trace embedded probe device which includes a circuit board and three probes. The circuit board includes an insulating layer unit, two grounding traces, a signal trace, a grounding layer, and a plurality of conductive vias. The insulating layer unit has an upper surface, a lower surface, and two first recesses and a second recess, which are recessed from the upper surface. The second recess is located between the two first recesses. Each of the grounding traces and the signal trace includes a trace main body. The trace main bodies of the two grounding traces are disposed in the two first recesses respectively and flush in elevation with the upper surface of the insulating layer unit. The trace main body of the signal trace is disposed in the second recess and flush in elevation with the upper surface of the insulating layer unit. The grounding layer is disposed on the lower surface of the insulating layer unit. The trace main body of each of the grounding traces is connected with the grounding layer by at least one of the conductive vias. Each of the conductive vias includes a through hole penetrating through an inner bottom surface of the first recess and the lower surface of the insulating layer unit, and a conductive layer disposed in the through hole. The trace main bodies of the grounding traces, the trace main body of the signal trace, the grounding layer and the conductive layers of the conductive vias are made of a same metal material. The probes are disposed on the grounding traces and the signal trace respectively.

As a result, the first and second recesses and through holes can be formed by laser drilling, or formed by laser drilling and photoresist of photolithography. By the first and second recesses and through holes, it is easy to control the positions, widths and thicknesses of the grounding traces, signal trace and conductive vias, and beneficial to achieve the requirement of fine pitch. The original copper layer of a substrate can be directly used to serve as the grounding layer. The trace main bodies of the grounding traces, the trace main body of the signal trace and the conductive layers of the conductive vias can be formed by electroplating at the same time, and then the trace main bodies of the grounding traces and the trace main body of the signal trace can be processed by grinding to become flush in elevation with the upper surface of the insulating layer unit. In this way, thin copper traces can be formed, and the surface roughness of the traces can be controlled. In addition, by adjusting the depth of the second recess, the thickness of the part of the insulating layer unit located below the signal trace can be adjusted, thereby facilitating to achieve the requirement of high frequency testing.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1A:
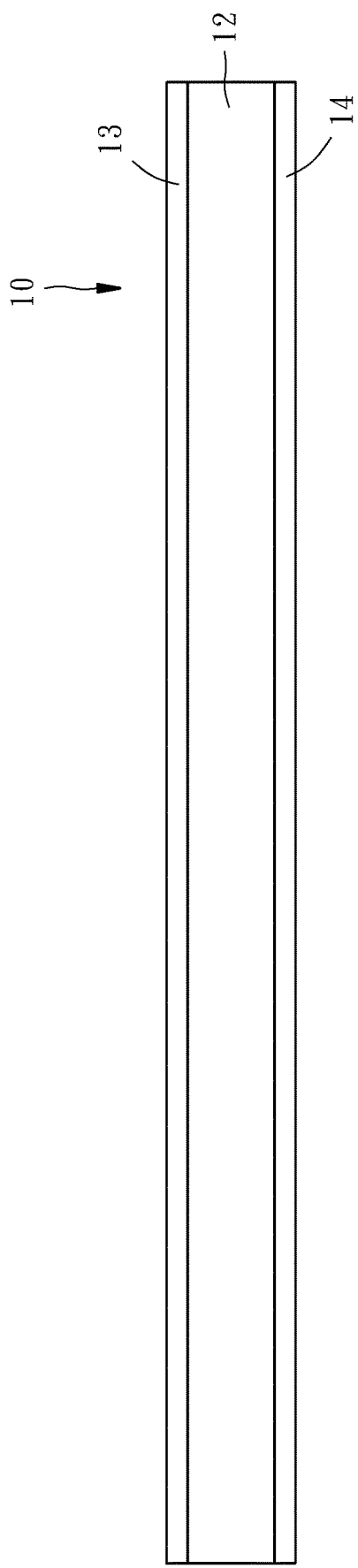
FIG. 1A is a schematic sectional view of a conventional flexible substrate.
Figure 1B:
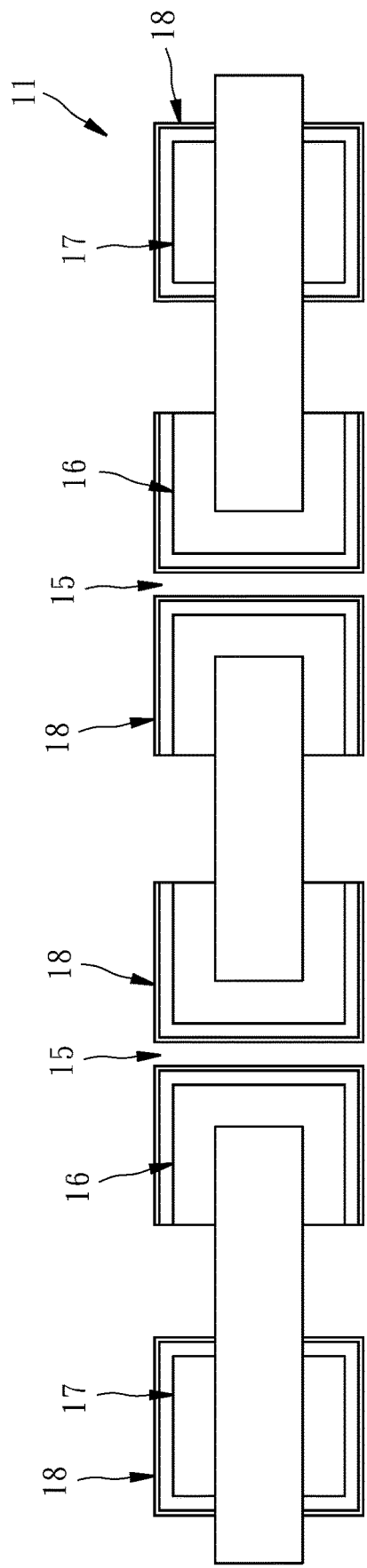
FIG. 1B is a schematic sectional view of a conventional flexible membrane circuit board.
Figure 2:
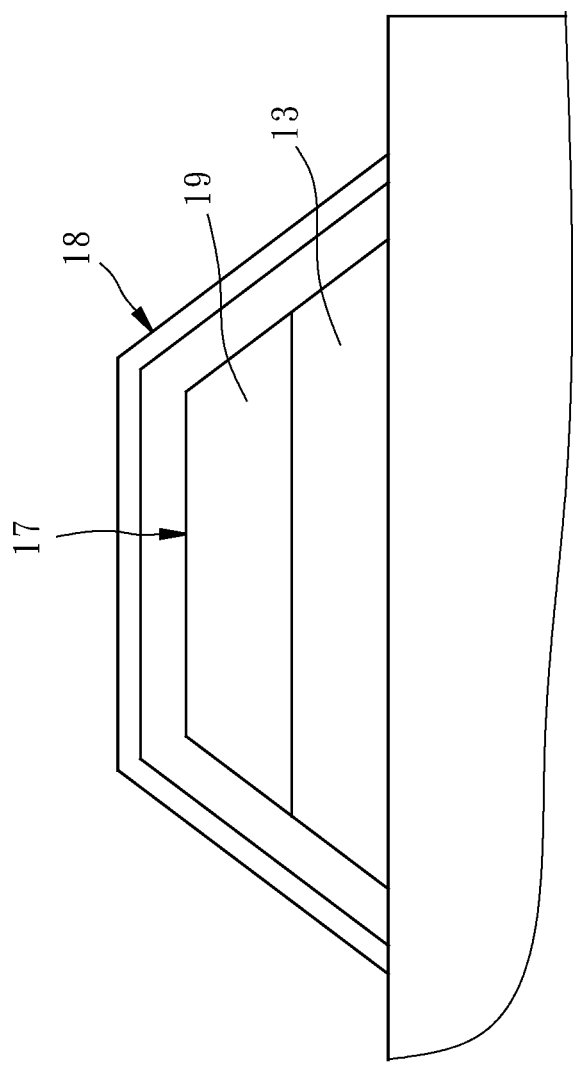
FIG. 2 is a partial schematic view of the flexible membrane circuit board shown in FIG. 1B.

First of all, it is to be mentioned that same reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Figure 3:
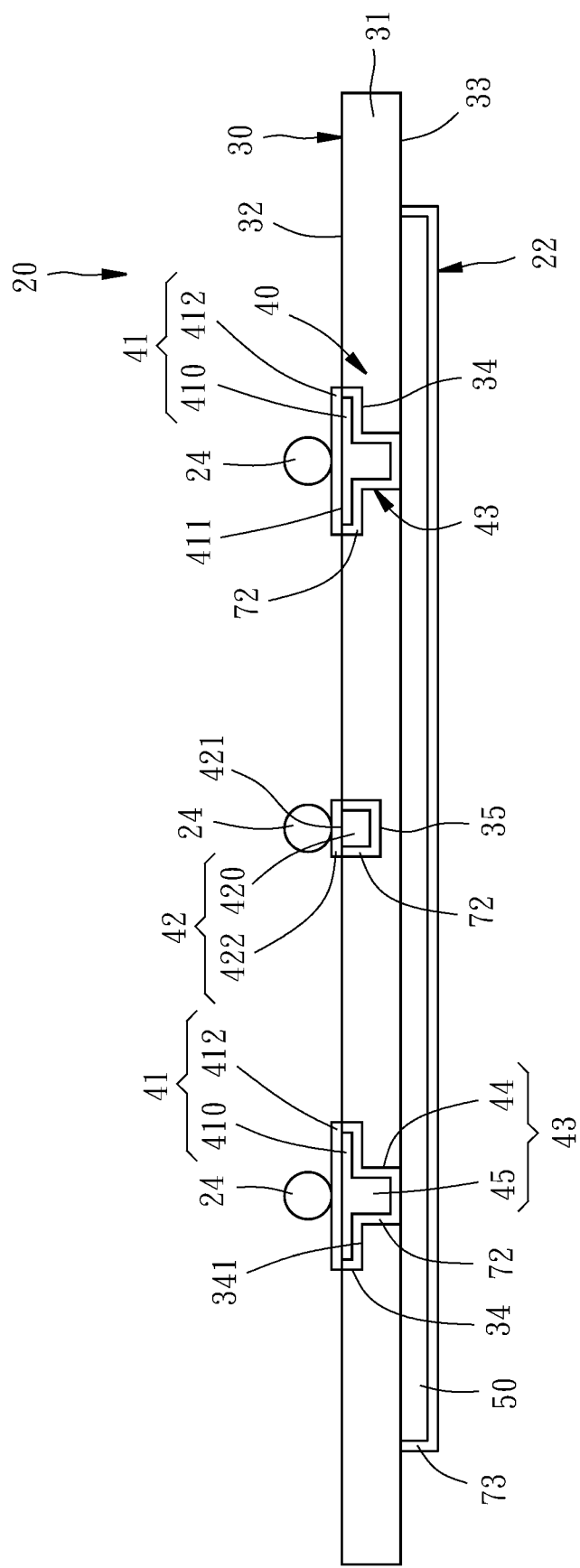
FIG. 3 is a schematic sectional view of a trace embedded probe device according to a first preferred embodiment of the present invention.

Referring to FIG. 3, a trace embedded probe device 20 according to a first preferred embodiment of the present invention includes a circuit board 22, and three probes 24. The circuit board 22 primarily includes an insulating layer unit 30, and a trace structure 40 and a grounding layer 50, which are disposed on the insulating layer unit 30.

In this embodiment, the insulating layer unit 30 includes only one insulating layer 31. The insulating layer 31 is a flexible board, which means the circuit board 22 in this embodiment is a flexible circuit board, but the present invention is unlimited thereto. In fact, the circuit board 22 in this embodiment may be made by etching, laser drilling, physical vapor deposition (also referred to as 'PVD' hereinafter), electroplating, grinding, electroless tin plating processes from the flexible substrate 10 mentioned in the description of the related art as shown in FIG. 1A. The insulating layer unit 30 has an upper surface 32, a lower surface 33, and two first recesses 34 and a second recess 35, which are recessed from the upper surface 32. The second recess 35 is located between the two first recesses 34. The first and second recesses 34 and 35 may be formed by the aforementioned laser drilling process.

The grounding layer 50 is a large-area metal layer directly disposed on the lower surface 33 of the insulating layer unit 30. The trace structure 40 includes two grounding traces 41, a signal trace 42, and a plurality of conductive vias 43 connecting the two grounding traces 41 with the grounding layer 50. Each of the grounding traces 41 primarily includes a trace main body 410. The trace main bodies 410 of the two grounding traces 41 are disposed in the two first recesses 34 respectively. The signal trace 42 primarily includes a trace main body 420. The trace main body 420 of the signal trace 42 is disposed in the second recess 35.

Figure 4:
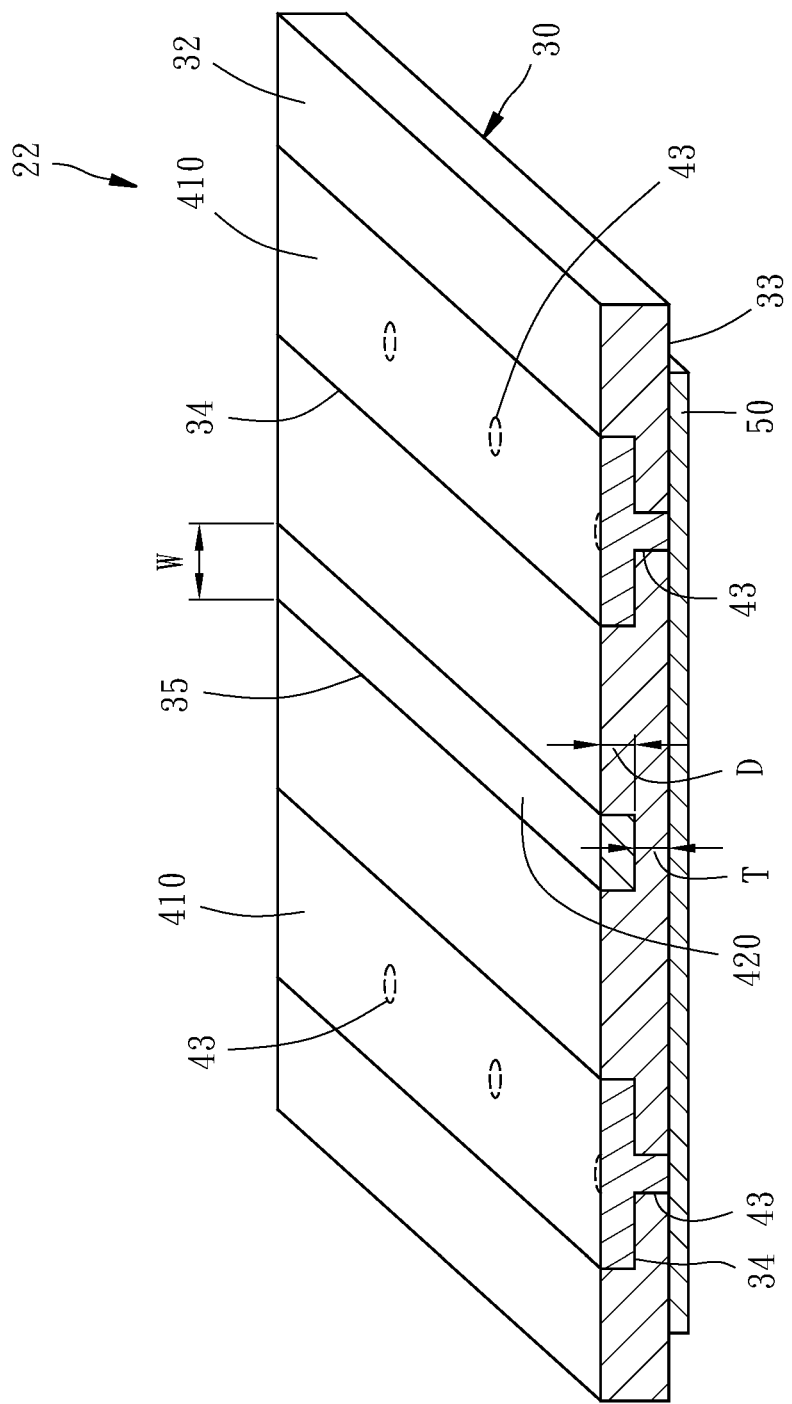
FIG. 4 is a schematic cutaway perspective view of a circuit board of the trace embedded probe device, but not showing seed layers and oxidation resistant layers.

The primary structure of the above-described circuit board 22 is schematically shown in FIG. 4. For the simplification of the figures and the convenience of illustration, the trace embedded probe device 20 and the partial circuit board 22 thereof are schematically shown in FIG. 3 and FIG. 4, and the features other than the above-described primary structure of the circuit board 22 are not shown in FIG. 4.

The trace main body 410 of each of the grounding traces 41 is electrically and mechanically connected with the grounding layer 50 by at least one conductive via 43. As shown in FIG. 4, there are usually a plurality of conductive vias 43 provided between the trace main body 410 of each grounding trace 41 and the grounding layer 50. As shown in FIG. 3, each of the conductive vias 43 includes a through hole 44 penetrating through an inner bottom surface 341 of the first recess 34 and the lower surface 33 of the insulating layer unit 30, and a conductive layer 45 disposed in the through hole 44. The through holes 44 can be formed by the aforementioned laser drilling process. The trace main bodies 410 of the grounding traces 41, the trace main body 420 of the signal trace 42 and the conductive layers 45 can be formed by electroplating at the same time to fill up the first and second recesses 34 and 35 and the through holes 44. The trace main bodies 410 of the grounding traces 41, the trace main body 420 of the signal trace 42, the conductive layers 45 and the grounding layer 50 are made of a same metal material, and preferably made of copper for attaining great electric conductivity. In fact, the original copper layer of the aforementioned flexible substrate 10 may, but not limited to, be directly used to serve as the grounding layer 50.

Before the trace main bodies 410 of the grounding traces 41, the trace main body 420 of the signal trace 42 and the conductive layers 45 are formed by the metal material by the aforementioned electroplating process, the structure located on the upper surface 31 of the insulating layer unit 30, including the first and second recesses 34 and 35 and the through holes 44, may, but not limited to, be plated with a seed layer of a material, such as titanium copper for example, by the aforementioned PVD process, thereby facilitating combination of the metal material with the insulating layer unit 30. The seed layer will be mostly removed in the grinding process after the electroplating process, but the part of the seed layer combined with the metal material will be retained. Therefore, a seed layer 72 is provided between the trace main body 410 or 420 of each of the grounding traces 41 and signal trace 42 and the insulating layer unit 30, which is the part of the seed layer provided by the aforementioned PVD process.

As described above, the grinding process is performed after the aforementioned electroplating process is accomplished, which makes the top surfaces 411 and 421 of the trace main bodies 410 and 420 of the grounding traces 41 and signal trace 42 flush in elevation with the upper surface 32 of the insulating layer unit 30. Then, each of the trace main bodies 410 of the grounding trace 41, the trace main body 420 of the signal trace 42 and the grounding layer 50 may, but not limited to, be covered by an oxidation resistant layer 412, 422 or 73 to avoid oxidation. The material of the oxidation resistant layers 412, 422 and 73 may, but not limited to, be tin and formed by electroless tin plating. In other words, in this embodiment each of the grounding traces 41 and signal trace 42 includes a trace main body 410 or 420, and an oxidation resistant layer 412 or 422. In fact, the top surfaces 411 and 421 of the trace main bodies 410 and 420 may be respectively covered by a cover layer of another material, such as covered by a cover layer made of gold for improving the electric conductivity. In other words, each of the grounding traces 41 and signal trace 42 in the present invention may be a single-layer structure including only the trace main body 410 or 420, such as the one shown in FIG. 7, wherein the probes are directly disposed on the trace main bodies, or may be a multi-layer structure including the trace main body 410 or 420 and at least one cover layer such as the aforementioned oxidation resistant layer 412 or 422 and/or the aforementioned cover layer made of gold.

Figure 5:
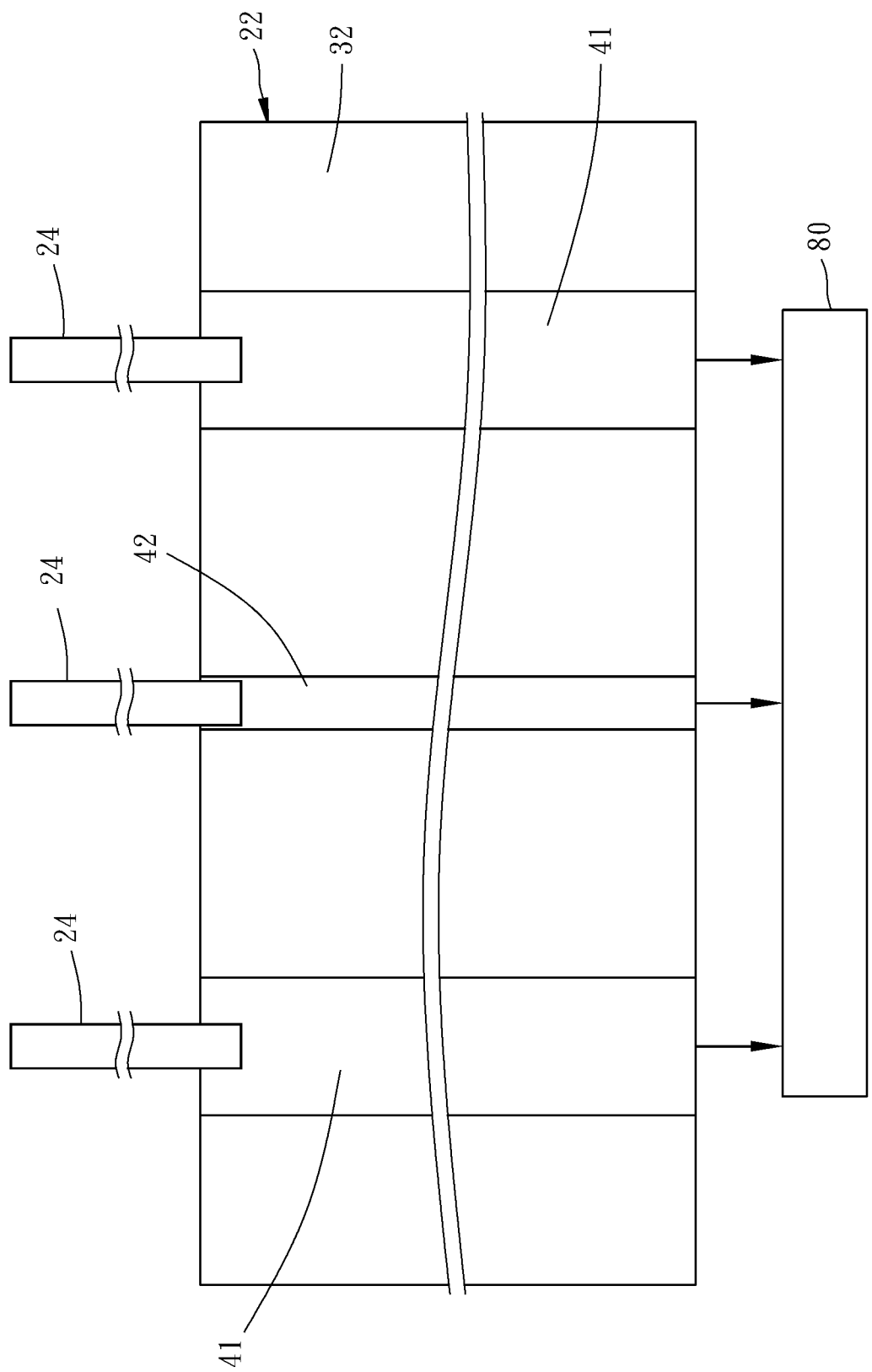
FIG. 5 is a schematic top view of the trace embedded probe device and a tester.

After the manufacture of the circuit board 22 is accomplished, the three probes 24 are disposed on the grounding traces 41 and signal trace 42 respectively by welding. Specifically speaking, the probes 24 in this embodiment are fixed to the oxidation resistant layers 412 and 422 of the grounding traces 41 and signal trace 42 respectively by welding. The probe 24 disposed on the signal trace 42 is a signal probe for transmitting test signal to the device under test (not shown). The probes 24 disposed on the two grounding traces 41 are grounding probes for transmitting grounding potential to the device under test. As shown in FIG. 5, each of the probes 24 in this embodiment is a cantilever probe. The probes 24 are partially fixed to an end of the grounding traces 41 and signal trace 42 respectively, and partially extend out of the circuit board 22 transversely, i.e., approximately extend parallel to the circuit board 22. Therefore, one ends of the grounding traces 41 and signal trace 42 are electrically connected with the probes 24 respectively, and the other ends of the grounding traces 41 and signal trace 42 are electrically connected with a tester 80.

Figure 6:
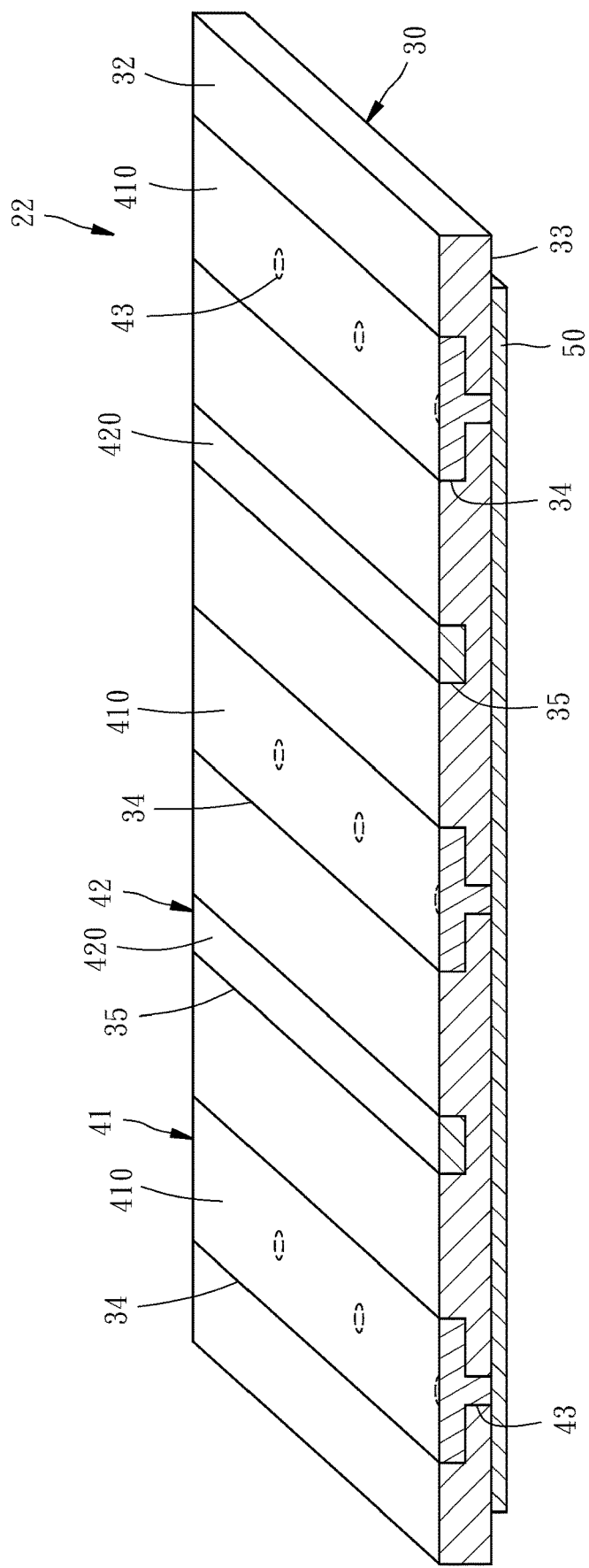
FIG. 6 is similar to FIG. 4, but showing the configuration with relatively more traces.
Figure 7:
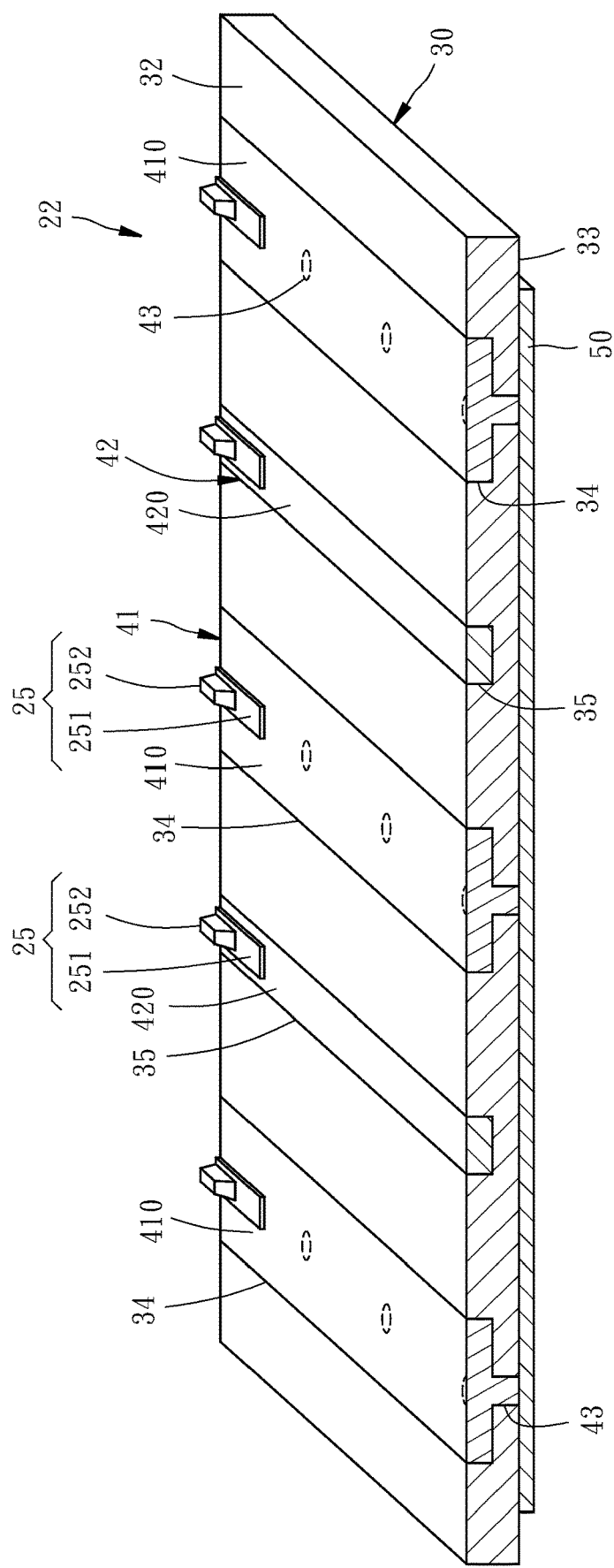
FIG. 7 is similar to FIG. 6, but further showing five probes.

It is to be mentioned that the configuration with only one signal trace 42 and two grounding traces 41 located by two opposite sides of the signal trace 42 is taken as an example in FIG. 3 to FIG. 5 for illustration. However, the trace structure 40 may include more grounding traces 41 and signal traces 42, and every signal trace 42 is located between two grounding traces 41 for attaining great impedance matching effect. For example, the configuration shown in FIG. 6 includes three grounding traces 41, and two signal traces 42 each located between two of the three grounding traces 41. Besides, the probes in the present invention are not limited to the aforementioned cantilever probes 24. For example, they may be the probes 25 as shown in FIG. 7. Each of the probes 25 includes a base 251 fixed to the grounding trace 41 or signal trace 42, and a pillar tip 252 extending from the base 251 vertically, i.e., approximately extending perpendicularly to the circuit board 22. The tip-shaped probes 25 as shown in FIG. 7 may be directly formed by electroplating on the grounding traces 41 and signal trace 42 of the circuit board 22 by microelectromechanical system (MEMS) manufacturing process. Alternatively, the circuit board 22 and the probes 25 may be manufactured separately, and thereafter the probes 25 may be fixed to the grounding traces 41 and signal traces 42 of the circuit board 22 by welding. Alternatively, the circuit board 22 may be provided with pillar-shaped structures fixed on the grounding traces 41 and signal traces 42, and then the pillar-shaped structures are formed into the probes 25 by etching.

Figure 8:
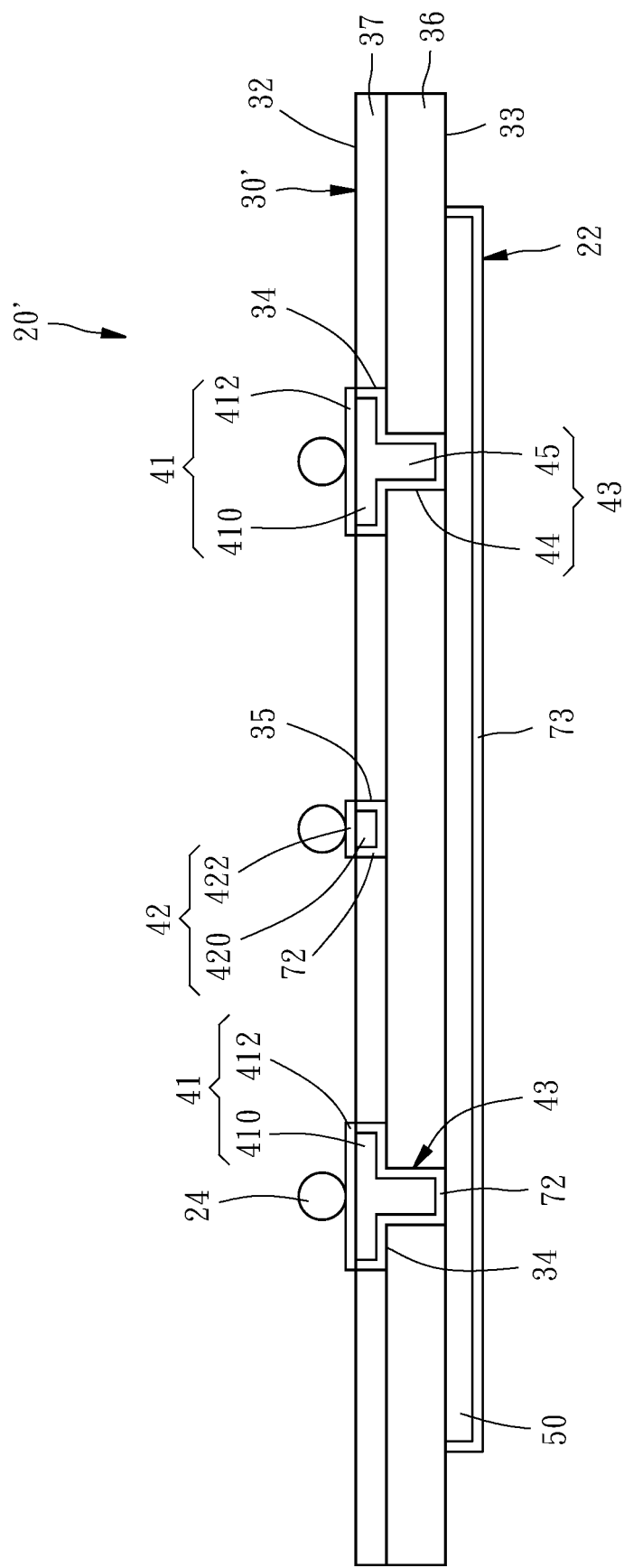
FIG. 8 is a schematic sectional view of a trace embedded probe device according to a second preferred embodiment of the present invention.

Referring to FIG. 8, a trace embedded probe device 20' according to a second preferred embodiment of the present invention is similar to the above-described trace embedded probe device 20, but the difference therebetween is that the insulating layer unit 30' of the trace embedded probe device 20' in this embodiment includes piled first and second insulating layers 36 and 37. The conductive vias 43 are disposed in the first insulating layer 36, and the trace main bodies 410 and 420 of the grounding traces 41 and signal trace 42 are disposed in the second insulating layer 37. The first insulating layer 36 is similar to the above-described insulating layer 31 of the trace embedded probe device 20, which may be the original insulating layer 12 of the flexible substrate 10 mentioned in the description of related art as shown in FIG. 1A, i.e., a flexible board, and may be formed with the through holes 44 of the conductive vias 43 by laser drilling. The second insulating layer 37 is a photoresist formed by photolithography, which is provided with the first and second recesses 34 and 35 for accommodating the trace main bodies 410 and 420 of the grounding traces 41 and signal trace 42. Same as the above-described first preferred embodiment, after the first and second insulating layers 36 and 37 of the insulating layer unit 30' are formed with the first and second recesses 34 and 35 and the through holes 44, the trace main bodies 410 and 420 of the grounding traces 41 and signal trace 42 flush in elevation with the upper surface 32 of the insulating layer unit 30', and the conductive layers 45 of the conductive vias 43 can be formed by electroplating and grinding processes. Likewise, before the electroplating process is performed, the aforementioned seed layers 72 can be formed by the PVD process. After the electroplating and grinding processes are accomplished, the aforementioned oxidation resistant layers 412, 422 and 73 can be formed by electroless tin plating.

By the above-described structure, the circuit board 22 of the trace embedded probe device 20 or 20' of the present invention can be formed with thin copper traces, and the surface roughness of the traces can be controlled. Besides, by the first and second recesses 34 and 35 and the through holes 44, it is easy to control the positions, widths and thicknesses of the grounding traces 41, signals trace 42 and conductive vias 43, thereby facilitating achievement of the requirement of fine pitch. In addition, the arrangement of the first and second recesses 34 and 35 reduce the thickness of the part of the insulating layer unit located below the traces. Especially, as shown in FIG. 4, by adjusting the depth D of the second recess 35, the thickness T of the part of the insulating layer unit 30 located below the signal trace 42 can be adjusted. Under the precondition that the characteristic impedance is unchanged, the smaller the thickness T of the insulating layer unit 30 is, the smaller the width W of the signal trace 42 can be. Therefore, the adjustment of the thickness T of the part of the insulating layer unit 30 located below the signal trace 42 may attain a required width W of the signal trace 42, thereby facilitating achievement of the requirement of high frequency testing.

It is to be mentioned that the distance between the signal trace 42 and the grounding trace 41 is designed according to the required impedance matching distance. If the probe 24 has a large diameter or width, it may result in that the impedance matching distance is not the distance between the edge of the signal trace 42 and the edge of the grounding trace 41, but the distance between the edge of the signal probe 24 and the edge of the grounding trace 41. However, it is hard to position the signal probe 24 on the signal trace 42 accurately by welding, so that the design and manufacture for impedance matching are difficult. Therefore, the probe 24 is preferably provided with a diameter or width smaller than or equal to the width of the signal trace 42 to prevent the probe 24 from being too large and thus affecting the design of the impedance matching distance between the signal trace 42 and the grounding trace 41.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A trace embedded probe device comprising:
a circuit board comprising:
an insulating layer unit having an upper surface, a lower surface, and two first recesses and a second recess, which are recessed from the upper surface, the second recess being located between the two first recesses;
two grounding traces each comprising a trace main body, the trace main bodies of the two grounding traces being disposed in the two first recesses respectively in a way that the trace main bodies of the two grounding traces are flush in elevation with the upper surface of the insulating layer unit;
a signal trace comprising a trace main body, the trace main body of the signal trace being disposed in the second recess in a way that the trace main body of the signal trace is flush in elevation with the upper surface of the insulating layer unit;
a grounding layer disposed on the lower surface of the insulating layer unit; and
a plurality of conductive vias arranged in a way that the trace main body of each of the grounding traces being connected with the grounding layer by at least one of the conductive vias, each of the conductive vias comprising a through hole penetrating through an inner bottom surface of the first recess and the lower surface of the insulating layer unit, and a conductive layer disposed in the through hole;
wherein the trace main bodies of the grounding traces, the trace main body of the signal trace, the grounding layer and the conductive layers of the conductive vias are made of a same metal material; and
three probes disposed on the grounding traces and the signal trace, respectively.

2. The trace embedded probe device as claimed in claim 1, wherein the metal material is copper.

3. The trace embedded probe device as claimed in claim 1, wherein a seed layer is provided between the trace main body of each of the grounding traces and the signal trace and the insulating layer unit; the seed layer is made of another metal material.

4. The trace embedded probe device as claimed in claim 3, wherein the seed layer is made of titanium copper.

5. The trace embedded probe device as claimed in claim 1, wherein each of the grounding traces and the signal trace further comprises at least one cover layer covering the trace main body thereof; each of the probes is connected to the cover layer of one of the grounding traces and the signal trace.

6. The trace embedded probe device as claimed in claim 5, wherein the at least one cover layer comprises an oxidation resistant layer; the oxidation resistant layer is made of another metal material.

7. The trace embedded probe device as claimed in claim 6, wherein the oxidation resistant layer is made of tin by an electroless tin plating process.

8. The trace embedded probe device as claimed in claim 1, wherein the insulating layer unit comprises only one insulating layer; the trace main bodies of the grounding traces, the trace main body of the signal trace and the conductive vias are disposed in the insulating layer.

9. The trace embedded probe device as claimed in claim 8, wherein the insulating layer is a flexible board.

10. The trace embedded probe device as claimed in claim 1, wherein the insulating layer unit comprises a first insulating layer and a second insulating layer piled on the first insulating layer; the conductive vias are disposed in the first insulating layer; the trace main bodies of the grounding traces and the trace main body of the signal trace are disposed in the second insulating layer.

11. The trace embedded probe device as claimed in claim 10, wherein the first insulating layer is a flexible board; the second insulating layer is a photoresist.

12. The trace embedded probe device as claimed in claim 1, wherein the grounding traces and the signal trace each have an end electrically connected with one of the probes, and the other end electrically connected with a tester.

13. The trace embedded probe device as claimed in claim 1, wherein each of the probes is a cantilever probe partially fixed to the circuit board and partially extending out of the circuit board transversely.

14. The trace embedded probe device as claimed in claim 1, wherein each of the probes comprises a pillar tip extending vertically.

* * * * *